United States Patent [19]

Kumagai et al.

[11] Patent Number: 5,168,341
[45] Date of Patent: Dec. 1, 1992

[54] BIPOLAR-CMOS INTEGRATED CIRCUIT HAVING A STRUCTURE SUITABLE FOR HIGH INTEGRATION

[75] Inventors: Kouichi Kumagai; Kenji Yoshida, both of Tokyo, Japan

[73] Assignee: NEC Corporation, Tokyo, Japan

[21] Appl. No.: 675,665

[22] Filed: Mar. 27, 1991

[30] Foreign Application Priority Data

Mar. 27, 1990 [JP] Japan .................... 1-78113

[51] Int. Cl.$^5$ ............................................ H01L 27/02
[52] U.S. Cl. ................................ 257/370; 257/371; 257/379
[58] Field of Search .................... 357/43, 42, 46, 51

[56] References Cited

U.S. PATENT DOCUMENTS 4,957,874 9/1990 Soejima .................................. 357/43
5,001,366 3/1991 Masuda et al. ......................... 357/43

Primary Examiner—Edward J. Wojciechowicz
Attorney, Agent, or Firm—Laff, Whitesel, Conte & Saret

[57] ABSTRACT

Herein disclosed is a bipolar-CMOS semiconductor circuit having a semiconductor substrate, an N$^-$ epitaxial layer formed on the semiconductor substrate, an N well formed in the N$^-$ epitaxial layer, a P well formed in the N$^-$ epitaxial layer, a power supply terminal to which the positive potential is to be supplied, a ground potential terminal, an input terminal, an output terminal, an NPN bipolar transistor formed in the N$^-$ epitaxial layer, the NPN bipolar transistor having the N$^-$ epitaxial layer as the collector thereof and having an emitter connected to the output terminal, a P-channel type MOS transistor formed in the N well and being connected between the power supply terminal and the base of the NPN bipolar transistor, the gate of the P-channel type MOS transistor being connected to the input terminal, and both the N well for the P-channel type MOS transistor and the N$^-$ epitaxial layer as the collector of the NPN bipolar transistor being connected to the power supply terminal, and an N-channel type MOS transistor formed in the P well and being connected between the output terminal and the ground potential terminal, the gate of the N-channel type MOS transistor being connected to the input terminal.

19 Claims, 5 Drawing Sheets

BIPOLAR-CMOS INTEGRATED CIRCUIT HAVING A STRUCTURE SUITABLE FOR HIGH INTEGRATION

BACKGROUND OF THE INVENTION

1. Field of the Invention

The present invention relates to a bipolar-CMOS (CMOS: Complementary Metal-Oxide-Semiconductor) semiconductor device wherein bipolar transistors and P- and N-channel type MOS field effect transistors are formed on a single semiconductor chip, and more particularly to an improvement of a bipolar-CMOS semiconductor device for enhancing its integration level.

2. Description of the Related Art

Heretofore, in a bipolar-CMOS semiconductor device, it was necessary to adopt a structure isolating the bipolar transistor from the substrate in order to take out a collector potential of an NPN bipolar transistor. For this reason, it was necessary to electrically isolate the collector of the bipolar transistor with a selectively oxidized layer or a P type semiconductor region, which led to a drawback in that the level of integration density is lowered considerably as compared to that of a genuine CMOS IC.

SUMMARY OF THE INVENTION

It is, therefore, a major object of the present invention to provide a bipolar-CMOS semiconductor device having a structure suitable for improving the integration density.

The semiconductor device according to the present invention includes a substrate, a semiconductor layer formed on the substrate and having an N conductivity type, a semiconductor region formed on the substrate and having a P conductivity type, an N-channel type MOS transistor formed in the semiconductor region, a P-channel type MOS transistor formed in the semiconductor layer, an NPN bipolar transistor formed in the semiconductor layer, the NPN bipolar transistor having the semiconductor layer as the collector thereof, and a power supply means for supplying a fixed potential to the semiconductor layer.

The semiconductor layer of an N type is preferably formed on an N type highly doped substrate or a P type substrate, taking the highest-potential on the chip. At this time, the supply of a highest potential to the region, that is the semiconductor layer, in which the P-channel type MOSFET are formed becomes the supply of a collector potential to the NPN bipolar transistor, rendering the substrate contact of the P-channel type MOSFET to be synonymous with the collector contact of the bipolar transistor. Further, it is possible to form a resistor in the semiconductor layer of an N type. Moreover, the drain of the P-channel type MOSFET and the base of the bipolar transistor can be formed as the same P type region so that the degree of integration can be further improved.

In this way, the present invention has a feature in that the isolation of the collector of the bipolar transistor is made unnecessary, and that the degree of integration can be made very high and the number of the fabrication steps can be reduced.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1:
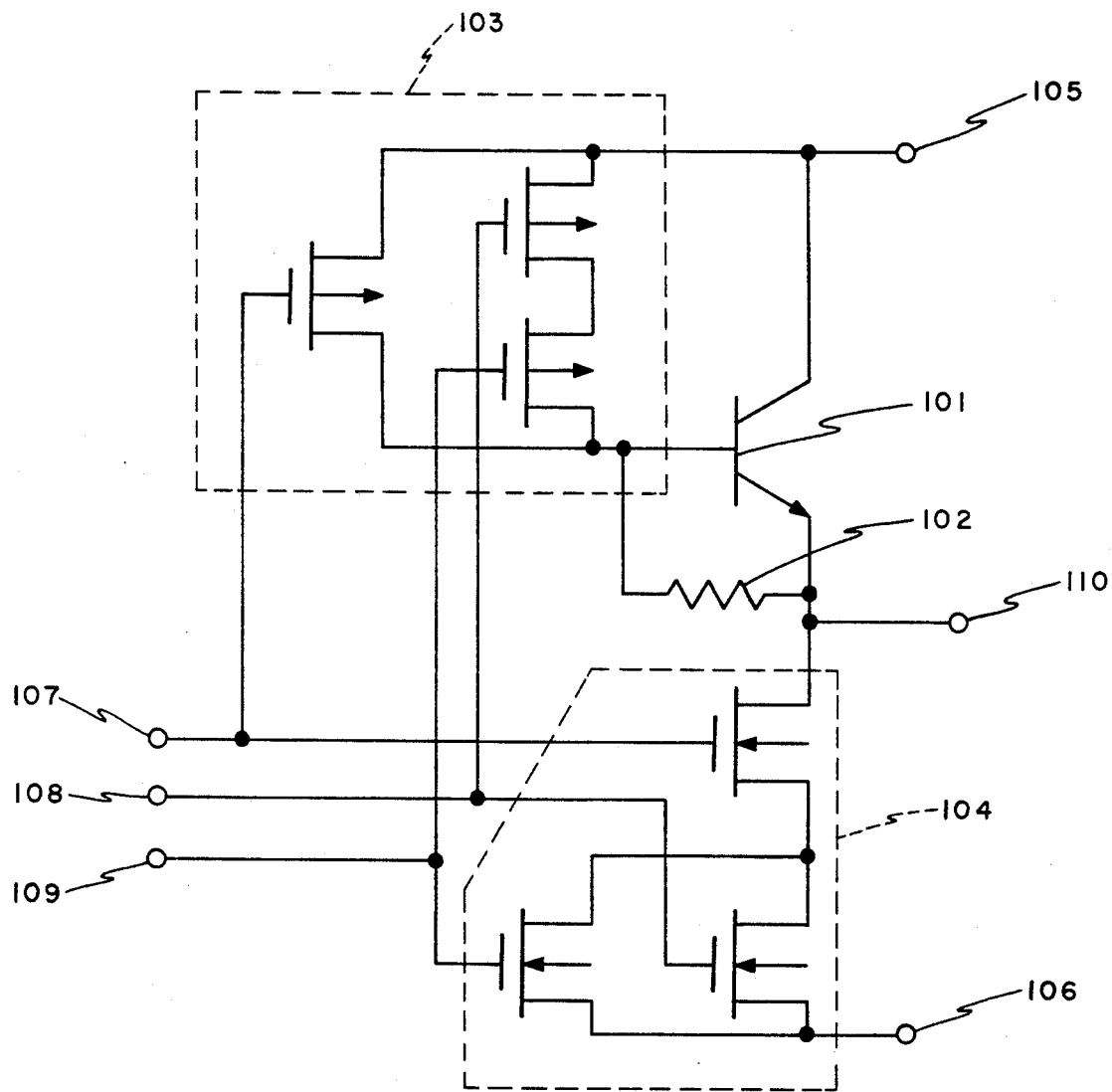
FIG. 1 is an equivalent circuit diagram of a circuit used in a first and a second embodiments of the present invention.

Referring to FIG. 1, an NPN bipolar transistor 101 amplifies a current supplied by a group of P-channel type MOSFETs 103, and charges a capacitive load (not shown) connected to an output terminal 110. A resistor 102 prevents an excessively large current which flows between a power supply 105 and a ground 106 by extracting the base current of the bipolar transistor 101 at the time discharging the load. A group of N-channel type MOSFETs 104 discharge the capacitive load therethrough. A power supply 105 has a potential of $V_{DD}$ which is positive with respect to the ground 106. The voltage level of the output terminal 110 varies depending upon the voltage levels that are applied to input terminals 107, 108 and 109.

Figure 2:
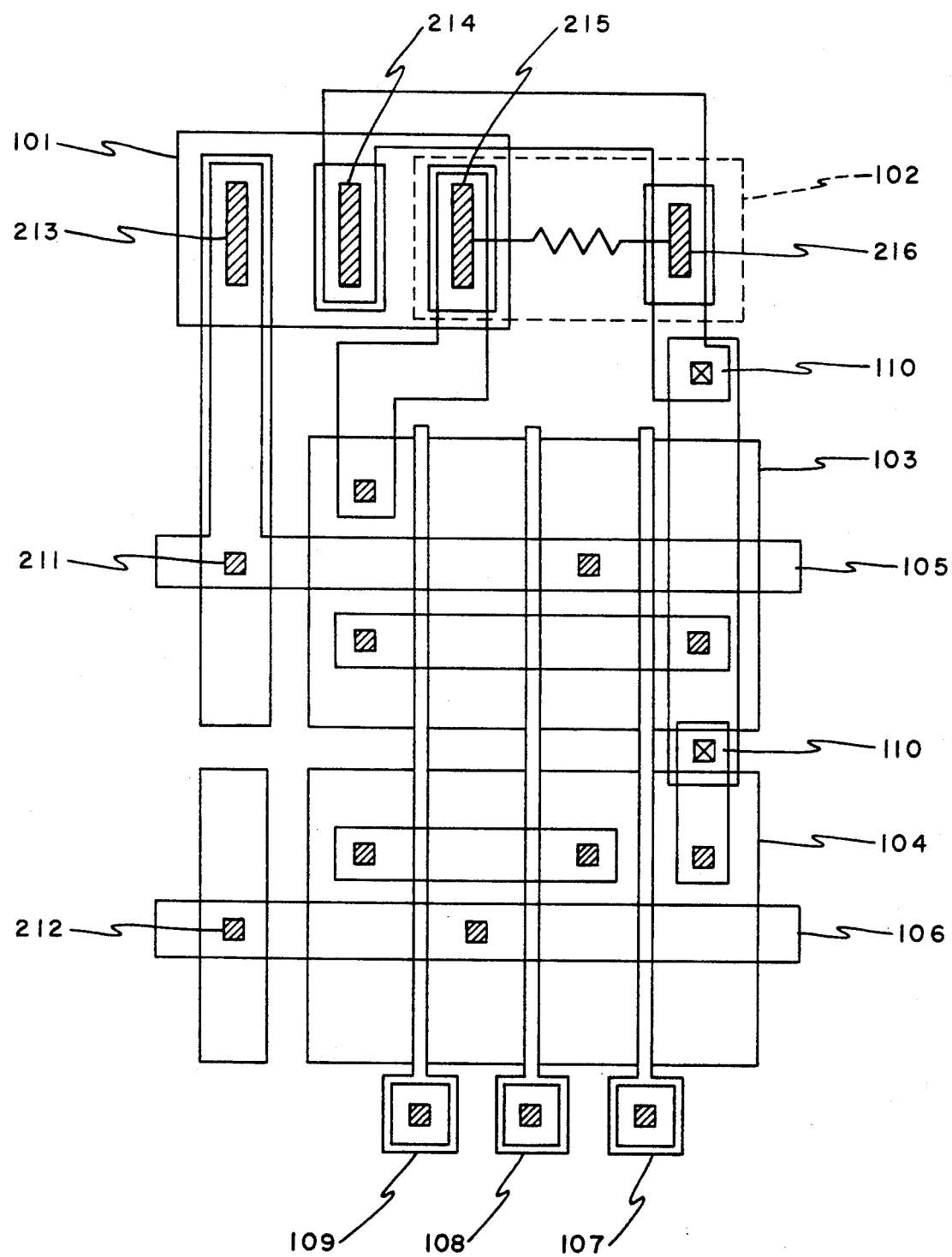
FIG. 2 is a plan view of a semiconductor device embodying the circuit in FIG. 1 as a first embodiment of the present invention.
Figure 3:
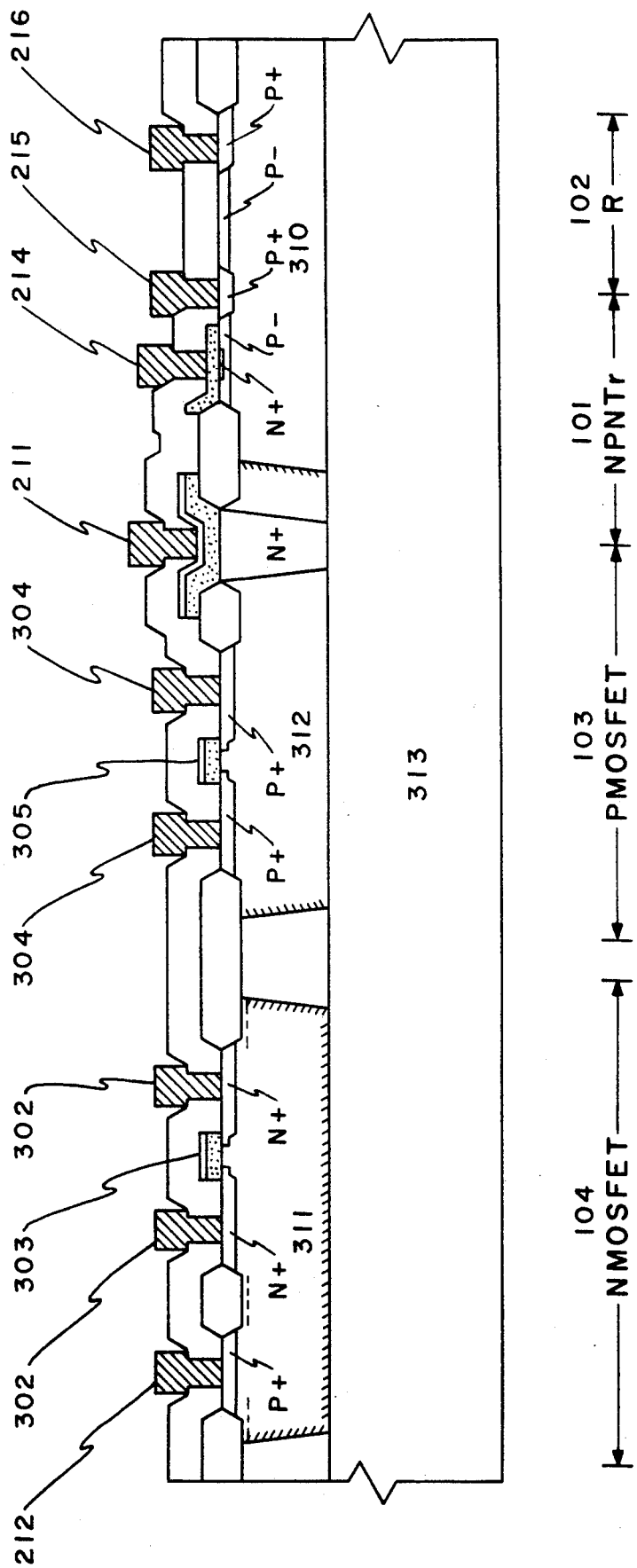
FIG. 3 is a sectional view for explaining the device structure shown in FIG. 2.

Referring to FIGS. 2 and 3, and N⁻ type epitaxial layer 310 is formed on an N type high concentration substrate 313. A P well 311 and an N well 312 are formed in the N⁻ type epitaxial layer 310. The NPN bipolar transistor 101 and the resistor 102 are formed in the N⁻ type epitaxial layer 310. The P-channel type MOSFET group 103 is formed in the N well 312. The N-channel type MOSFET group 104 is formed in the p well 311. P well 311 is connected to the ground 106 through P well contact 211. N-channel type MOSFET has a gate electrode 303 and a source and a drain thereof are taken out through source/drain contact 302. P-channel type MOSFET has a gate electrode 305 and a source and a drain thereof are taken out through source/drain contact 304. The N well is connected to the power supply 105 through N well contact 211. A collector, an emitter and a base of the NPN bipolar transistor 101 are taken out through a collector contact 213, an emitter contact 214 and a base contact 215, respectively, and the collector of the bipolar transistor 101 is also connected to the power supply 105 through the collector contact 213. The highest potential on the chip is supplied to the power supply 105. Both sides of the resistor 102 are taken out through the base contact 215 and a resistor contact 216, respectively. The output terminal 110 is connected by a second wiring layer. In this embodiment, because both the N-well 312 in which the P-channel type MOSFET group 103 is formed and the collector of the NPN bipolar transistor, collector which corresponds to the N⁻ type epitaxial layer 310, are connected to the power supply 105, there is no need to form an isolation region for the NPN bipolar transistor 101. Incidentally, in this embodiment, the N-well 312 and the collector of the NPN bipolar transistor 101 are taken out through the P-well contact 211 and the collector contact 213, respectively, but the N-well 312 and the collector of the NPN bipolar transistor 101 can be taken out through the sole contact of either the P-well contact 211 or the collector contact 213 to enhance the integration level.

Figure 4:
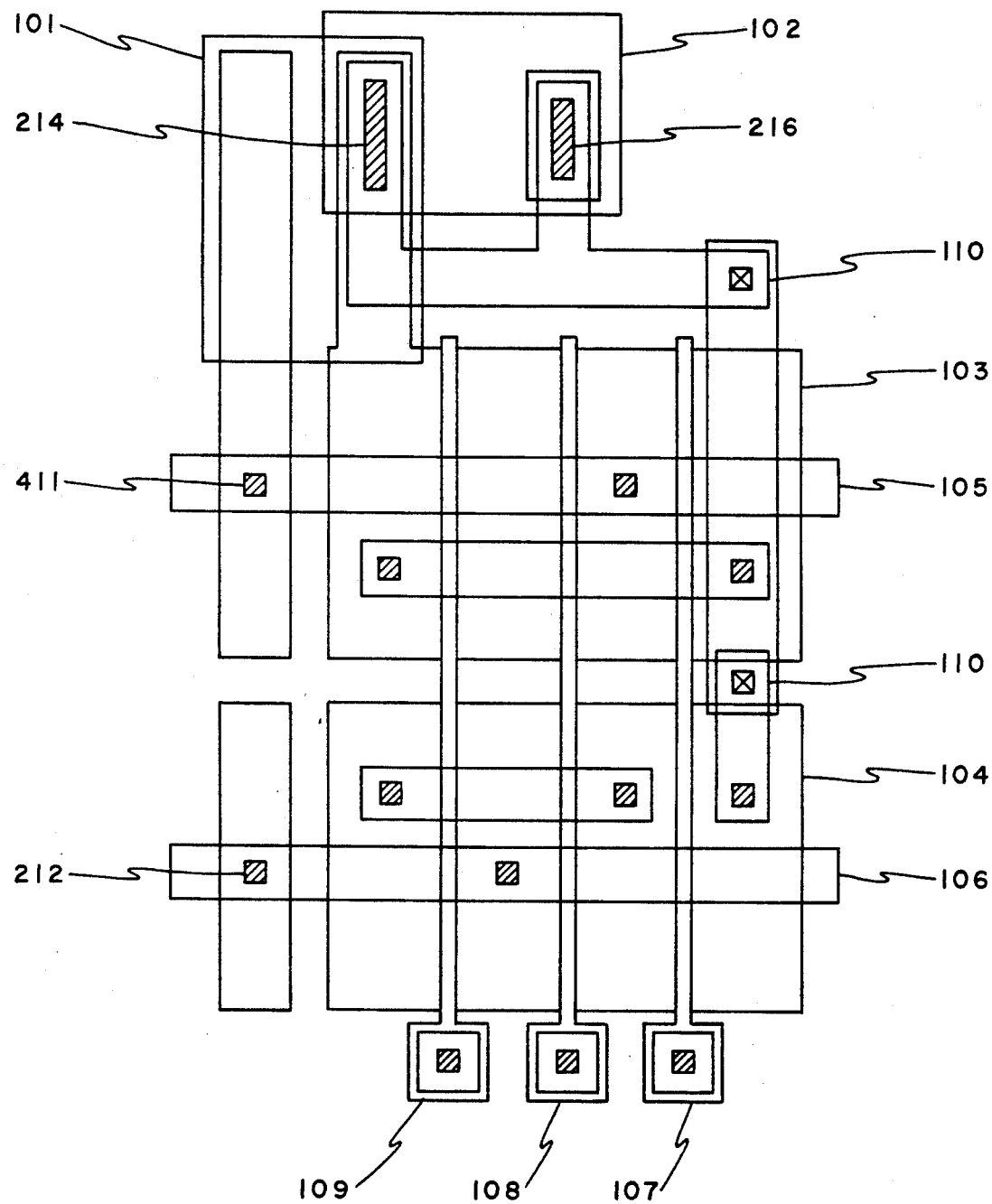
FIG. 4 is a plan view corresponding to FIG. 1 of a second embodiment of the present invention.

FIG. 4 is a plan view for a second embodiment which is obtained by further increasing the degree of integration of the first embodiment shown in FIG. 2. In the first embodiment the base region of the bipolar transistor 101 and the drain of the P-channel type MOSFET are formed individually, but in the present embodiment they are constructed in the same P type diffused layer region. Here, reference numeral 411 serves for both of the collector contact of the bipolar transistor 101 and the contact for the N well. In accordance with the present embodiment it is possible to further enhance the degree of integration.

Figure 5:
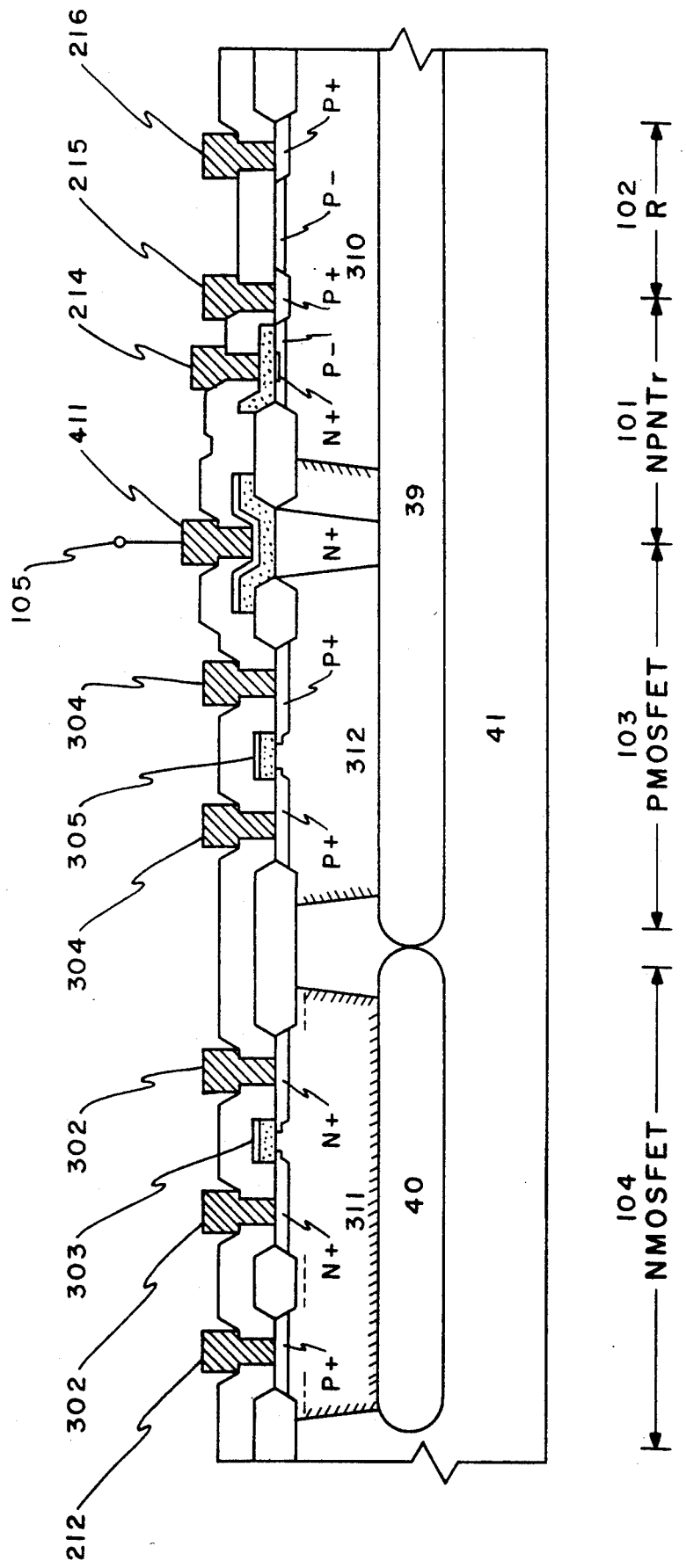
FIG. 5 is a sectional view of a third embodiment of the present invention.

Referring to FIG. 5, in manufacturing the semiconductor device of the third embodiment, an N⁻ type epitaxial layer 310 is grown after forming an N+ type buried layer 39 and a P+ type buried layer 40 on a P⁻ substrate 41. Then an N well 38 and a P well 37 are formed on the N+ type buried layer 39 and the P+ type buried layer 40, respectively. Then the P-channel type MOSFET group 103 and the N-channel type MOSFET group 104 are formed in the N type well 312 and P type well 311, respectively. The NPN bipolar transistor 101 and the resistor 102 are formed in the N⁻ epitaxial layer 310. Both N type well 312 and the collector of the NPN transistor 101 is connected to the power supply 105 through a contact 411.

What is claimed is:

1. A semiconductor device comprising:
   a substrate having a first semiconductor layer formed thereon;
   a first semiconductor region formed in said layer and on a first portion of said substrate and having a first conductivity type;
   a second semiconductor region formed in said layer and on a second portion of said substrate and having a second conductivity type;
   a first channel type MOS transistor formed in said second semiconductor region;
   a second channel type MOS transistor formed in said first semiconductor region;
   a bipolar transistor formed in a remaining portion of said first semiconductor region, said bipolar transistor having said first semiconductor region as the collector thereof;
   a resistor formed in said remaining portion of said first semiconductor region with said second conductivity type as an extended portion of a base region of said bipolar transistor; and
   a power supply means for supplying a fixed potential to said first semiconductor region.

2. A semiconductor device as recited in claim 1, wherein said substrate is a semiconductor substrate of said first conductivity type.

3. A semiconductor device as recited in claim 1, wherein said substrate is a semiconductor substrate of said second conductivity type.

4. A semiconductor device as recited in claim 3, further comprising a first conductivity type buried layer and a second conductivity type buried layer, said first conductivity type buried layer being formed between said substrate and said first semiconductor region and having an impurity concentration which is higher than that of said first semiconductor region, and second conductivity type buried layer being formed between said substrate and said second semiconductor region and having an impurity concentration which is higher than that of said second semiconductor region.

5. A semiconductor device as recited in claim 1, wherein said fixed potential is positive with reference to ground potential.

6. A semiconductor device as recited in claim 5, wherein said fixed potential is the highest potential among potentials applied to said semiconductor device.

7. A bipolar-CMOS semiconductor circuit comprising:
   a substrate;
   a semiconductor layer formed on a first portion of said substrate, said semiconductor layer being of a first conductivity type;
   a semiconductor region formed on a second portion of said substrate, said semiconductor region being of a second conductivity type which is opposite to said first conductivity type;
   a first power terminal;
   a second power terminal;
   an input terminal;
   an output terminal;
   a bipolar transistor formed in said semiconductor layer, said bipolar transistor having said semiconductor layer as the collector thereof, and having an emitter-collector current path coupled between said first power terminal and said output terminal;
   a first MOS transistor formed in said semiconductor region, said first MOS transistor having a first source-drain current path coupled between said output terminal and said second power terminal, and said first source-drain current path being controlled in response to an input signal applied to said input terminal; and
   a second MOS transistor formed in said semiconductor layer, said second MOS transistor having a second source-drain current path coupled between said first power terminal and a base of said bipolar transistor, and said second source-drain current path being controlled in response to said input signal applied to said input terminal.

8. A bipolar-CMOS transistor as recited in claim 7, further comprising a resistor coupled between said emitter and said base of said bipolar transistor.

9. A bipolar-CMOS transistor as recited in claim 8, wherein said resistor is formed in said semiconductor layer.

10. A bipolar-CMOS transistor as recited in claim 7, further comprising a second semiconductor region formed in said semiconductor layer, said second semiconductor region being of said first conductivity type and having an impurity concentration higher than that of said semiconductor layer, said second MOS transistor being formed in said second semiconductor region, and said second semiconductor region and said semiconductor layer being electrically connected to said first power terminal.

11. A bipolar-CMOS transistor as recited in claim 7, wherein said substrate is a semiconductor substrate of said first conductivity type.

12. A bipolar-CMOS transistor as recited in claim 7, wherein said substrate is a semiconductor substrate of said second conductivity type.

13. A bipolar-CMOS transistor as recited in claim 7, wherein said first conductivity type is an N conductivity type, said second conductivity type is a P conductivity type, said bipolar transistor is an NPN bipolar transistor, said first MOS transistor is an N-channel type MOS transistor and said second MOS transistor is a P-channel type MOS transistor.

14. A bipolar-CMOS transistor as recited in claim 9, wherein said first conductivity type is an N conductivity type, said second conductivity type is a P conductivity type, said bipolar transistor is an NPN bipolar transistor, said first MOS transistor is an N-channel type MOS transistor and said second MOS transistor is a P-channel type MOS transistor.

15. A bipolar-CMOS transistor as recited in claim 10, wherein said first conductivity type is an N conductivity type, said second conductivity type is a P conductivity type, said bipolar transistor is an NPN bipolar transistor, said first MOS transistor is an N-channel type MOS transistor and said second MOS transistor is a P-channel type MOS transistor.

16. A bipolar-CMOS transistor as recited in claim 11, wherein said first conductivity type is an N conductivity type, said second conductivity type is a P conductivity type, said bipolar transistor is an NPN bipolar transistor, said first MOS transistor is an N-channel type MOS transistor and said second MOS transistor is a P-channel type MOS transistor.

17. A bipolar-CMOS transistor as recited in claim 12, wherein said first conductivity type is an N conductivity type, said second conductivity type is a P conductivity type, said bipolar transistor is an NPN bipolar transistor, said first MOS transistor is an N-channel type MOS transistor and said second MOS transistor is a P-channel type MOS transistor.

18. A bipolar-CMOS transistor as recited in claim 7, wherein a positive potential is to be supplied to said first power terminal and the ground potential is to be supplied to said second power terminal.

19. A bipolar-CMOS transistor as recited in claim 13, wherein a positive potential is to be supplied to said first power terminal and the ground potential is to be supplied to said second power terminal.

* * * * *